(12) United States Patent
Lee et al.

(10) Patent No.: US 8,637,135 B2
(45) Date of Patent: Jan. 28, 2014

(54) NON-UNIFORM SEMICONDUCTOR DEVICE ACTIVE AREA PATTERN FORMATION

(75) Inventors: Tsung-Lin Lee, Hsin-Chu (TW); Shao-Ming Yu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 347 days.

(21) Appl. No.: 12/856,343

(22) Filed: Aug. 13, 2010

(65) Prior Publication Data

US 2011/0115024 A1     May 19, 2011

Related U.S. Application Data

(60) Provisional application No. 61/262,270, filed on Nov. 18, 2009.

(51) Int. Cl.
    *G03B 21/62* (2006.01)
(52) U.S. Cl.
    USPC ............................ 428/149; 428/147; 428/253
(58) Field of Classification Search
    USPC .......................................... 428/149, 253, 147
    See application file for complete search history.

(56) References Cited

U.S. PATENT DOCUMENTS

| | | |
|---|---|---|
| 6,537,888 B2 | 3/2003 | Lee |
| 6,706,571 B1 | 3/2004 | Yu et al. |
| 6,858,478 B2 | 2/2005 | Chau et al. |
| 7,190,050 B2 | 3/2007 | King et al. |
| 7,247,887 B2 | 7/2007 | King et al. |
| 7,265,008 B2 | 9/2007 | King et al. |
| 7,453,124 B2 | 11/2008 | Adan |
| 7,508,031 B2 | 3/2009 | Liu et al. |
| 7,528,465 B2 | 5/2009 | King et al. |
| 7,605,449 B2 | 10/2009 | Liu et al. |
| 7,838,345 B2 * | 11/2010 | Shi et al. ........................ 438/149 |
| 2004/0036127 A1 | 2/2004 | Chau et al. |
| 2005/0153490 A1 | 7/2005 | Yoon et al. |
| 2005/0250285 A1 | 11/2005 | Yoon et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2008/0290470 A1 | 11/2008 | King et al. |
| 2008/0296632 A1 | 12/2008 | Moroz et al. |
| 2009/0181477 A1 | 7/2009 | King et al. |

FOREIGN PATENT DOCUMENTS

| | | |
|---|---|---|
| JP | 2003229575 A | 8/2003 |
| KR | 10-2006-0046490 | 5/2006 |
| KR | 10-2008-0029491 | 4/2008 |
| TW | 490799 | 6/2002 |

\* cited by examiner

*Primary Examiner* — Long Pham
*Assistant Examiner* — Steven Rao
(74) *Attorney, Agent, or Firm* — Slater & Matsil, L.L.P.

(57) ABSTRACT

In accordance with an embodiment, a semiconductor device comprises at least three active areas. The at least three active areas are proximate. Longitudinal axes of the at least three active areas are parallel, and each of the at least three active areas comprises an edge intersecting the longitudinal axis of the respective active area. The edges of the at least three active areas form an arc.

20 Claims, 9 Drawing Sheets

NON-UNIFORM SEMICONDUCTOR DEVICE ACTIVE AREA PATTERN FORMATION

This application claims the benefit of U.S. Provisional Patent Application Ser. No. 61/262,270 filed on Nov. 18, 2009, and entitled "Non-Uniform Semiconductor Device Active Area Pattern Formation," which application is incorporated herein by reference.

TECHNICAL FIELD

The disclosure relates generally to a semiconductor device and method for forming the semiconductor device and, more particularly, to a semiconductor device having non-uniform active areas and a method for forming such device.

BACKGROUND

Generally, transistor active areas within a given semiconductor substrate surface area all have a uniform length, such that the surface area that comprises the active areas is rectangular with each active area's length being the length of the rectangular area. However, this patterning may result in higher corner stress in each active area and in higher stress in each active area and the shallow trench isolation (STI) adjoining the active area. For example, the oxide in the STI may cause a tensile stress in the STI and a compressive stress in the active area. Further, this patterning generally creates more difficulty in processing, particularly in etching. This may be because occasionally different spaces between adjacent active areas cause different loading effects and chemical reactions such that keeping the active areas uniform may be difficult.

These problems may become more pronounced as transistor sizes are further scaled down. The problems may be present in both planar field effect transistors and in fin field effect transistors (FinFETs), but may be more problematic in FinFETs. Accordingly, there is a need in the art to overcome these problems and disadvantages.

SUMMARY

These and other problems are generally solved or circumvented, and technical advantages are generally achieved, by embodiments.

In accordance with an embodiment, a semiconductor device comprises at least three active areas. The at least three active areas are proximate. Longitudinal axes of the at least three active areas are parallel, and each of the at least three active areas comprises an edge intersecting the longitudinal axis of the respective active area. The edges of the at least three active areas form an arc.

Another embodiment is a method for forming a semiconductor device. The method comprises providing a semiconductor substrate, forming a photoresist layer over the semiconductor substrate, patterning the photoresist layer over the semiconductor substrate to expose an exposed portion of the semiconductor substrate using a photomask, and etching the exposed portion of the semiconductor substrate such that an edge of the exposed portion of the semiconductor substrate defines edges of active areas. The photomask comprises a transparent area comprising a curved edge, and the curved edge defines the edge of the exposed portion of the semiconductor substrate. Each active area comprises a longitudinal length intersecting one respective edge.

A further embodiment is a method for forming a semiconductor device. The method comprises providing a semiconductor substrate, forming fins on the semiconductor substrate, and patterning the fins such that each of the fins comprises an edge and the edges of the fins form an arc.

BRIEF DESCRIPTION OF THE DRAWINGS

For a more complete understanding of embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments will be described in a specific context, namely a non-uniform pattern of active areas for fin field effect transistors (FinFETs). Other embodiments may also include applications with other transistors, such as planar field effect transistors, or for different design purposes, such as to improve performance or reliability.

Figure 1A:
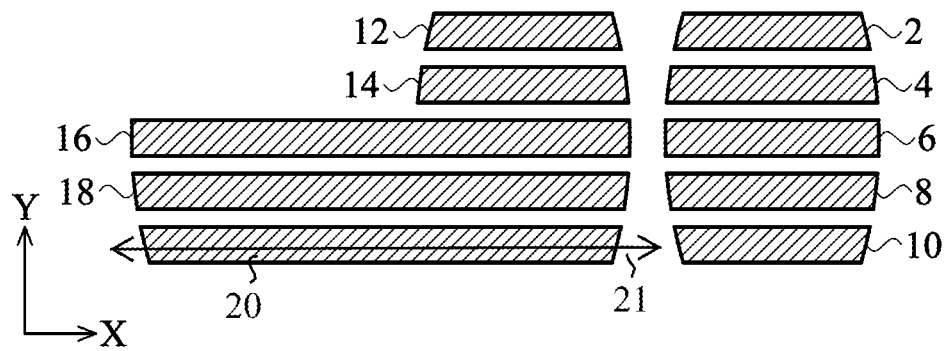
FIG. 1A is a layout of an area of a semiconductor substrate that comprises transistor active areas in accordance with an embodiment.
Figure 1B:
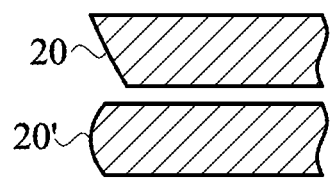
FIG. 1B is a portion of the layout in FIG. 1A with an alternate edge of an active area in accordance with a further embodiment.

FIG. 1A illustrates a layout of an area of a semiconductor substrate that comprises transistor active areas in accordance with embodiments. The layout comprises a pattern of active areas 2 through 20. The pattern is not uniform in that the edges of a group of active areas conform to the shape of a convex arc with respect to the center of the group. It should be noted that the radius of the convex arc may extend to a point within the pattern or may extend to a point outside of the pattern. The respective edges discussed that conform to arcs are the edges and/or surfaces of an active area that intersect a longitudinal axis of the active area. A longitudinal axis is a line that runs in a direction substantially parallel to a length of a channel of an active area or, as illustrated in the figures, runs parallel to the x-axis. An example longitudinal axis 21 of active area 20 is shown in FIG. 1A. An edge for a single active area may be substantially conformal to the arc, but may also be rounded such that the individual edge is not substantially conformal to the arc, particularly due to the processing window. These two situations are illustrated in FIG. 1B. FIG. 1B illustrates an edge of active area 20 as depicted in FIG. 1A as substantially conformal to the arc and an example of an edge of active area 20' when the edge is rounded. Each example is considered within the scope of embodiments.

Figure 2:
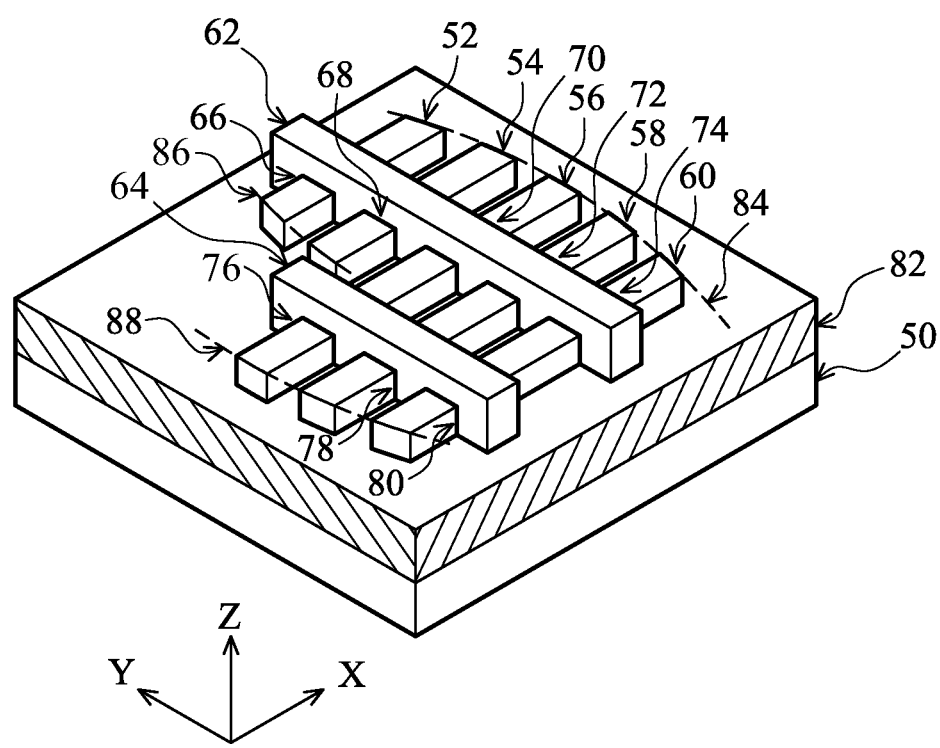
FIG. 2 is a three-dimensional illustration of a semiconductor substrate that comprises FinFETs with active areas in accordance with an embodiment.

FIG. 2 is a three-dimensional illustration of a similar area of a semiconductor substrate 50 that comprises FinFETs with active areas in accordance with embodiments. The structure comprises active areas, or fins, 52 through 60 and gate electrodes 62 and 64 that form the FinFETs 66 through 80. The structure further comprises isolation region 82 surrounding the active areas 52 through 60. Other components are omitted for simplicity, such as dielectric layers, particularly the gate dielectric layer. Similar to FIG. 1A, the active areas have non-uniform edges. As can be seen in FIG. 2, the right edges of active areas 52 through 60 for FinFETs 66 through 74 conform to the convex arc 84. Further, the left edges of active areas 52 and 54 conform to convex arc 86. Likewise, the left edges of active areas 56 through 60 for FinFETs 76, 78, and 80 conform to convex arc 88.

The embodiments shown in FIGS. 1A-B and 2 realize advantages over conventional uniform patterns of active areas. By using these embodiments, the active areas near the edge of the non-uniform pattern may be smaller. Reducing the size of the boundary active areas with respect to active areas that are more central to the pattern in this manner may reduce the stress in the STI region surrounding the active areas in the pattern. The reduced size of the boundary active areas may allow the STI region to be larger which may cause a tensile stress in the STI to be relaxed. This may be advantageous to prevent STI region breakdown and to prevent leakage current.

Figure 3:
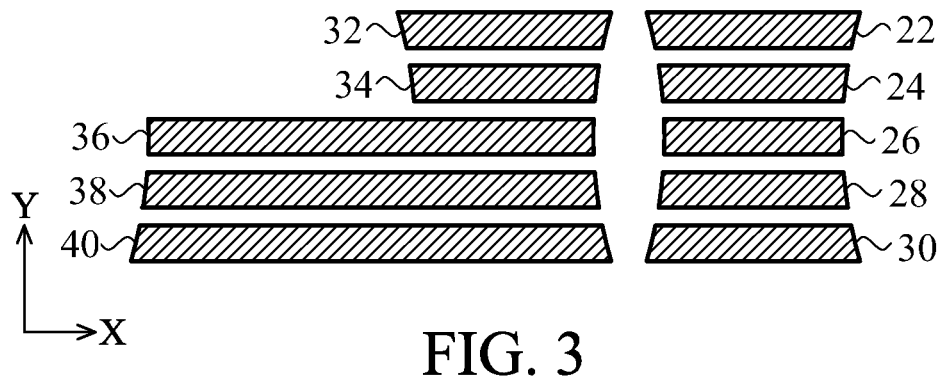
FIG. 3 is a layout of an area of a semiconductor substrate that comprises transistor active areas in accordance with another embodiment.

FIG. 3 illustrates a layout of an area of a semiconductor substrate that comprises transistor active areas in accordance with other embodiments. The layout comprises a pattern of active areas 22 through 40. The pattern is not uniform in that edges of a group of active areas conform to the shape of a concave arc with respect to the center of the group. Similar to FIG. 1B, the individual edges of the active areas may be formed in a manner in which each edge is not substantially conformal to the arc due to processing.

Figure 4:
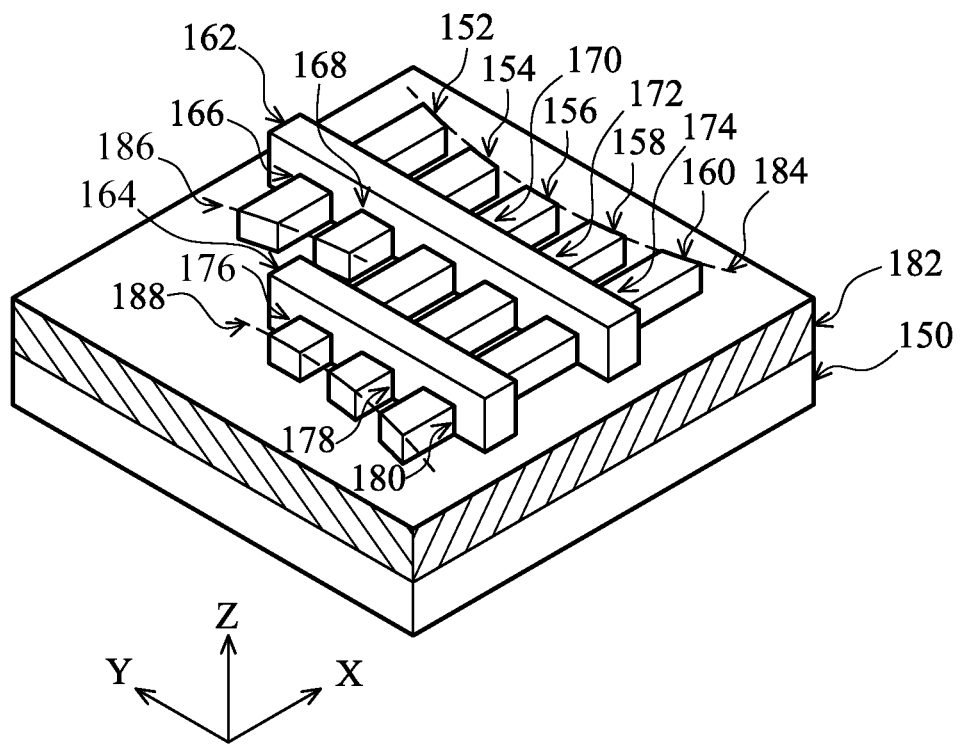
FIG. 4 is a three-dimensional illustration of a semiconductor substrate that comprises FinFETs with active areas in accordance with another embodiment.

FIG. 4 is a three dimensional illustration of a similar area of a semiconductor substrate 150 that comprises FinFETs with active areas in accordance with embodiments. The structure comprises active areas, or fins, 152 through 160 and gate electrodes 162 and 164 that form the FinFETs 166 through 180. The structure further comprises isolation region 182 surrounding the active areas 152 through 160. Similar to FIG. 3, the active areas have non-uniform edges. As can be seen in FIG. 4, the edges of active areas 152 through 160 for FinFETs 166 through 174 conform to the concave arc 184. Further, the edges of active areas 152 and 154 conform to concave arc 186. Likewise, the edges of active areas 156 through 160 for FinFETs 176, 178, and 180 conform to concave arc 188.

The embodiments shown in FIGS. 3 and 4 realize advantages over conventional uniform patterns of active areas. By using these embodiments, the active areas near the edge of the non-uniform pattern may be larger. Increasing the size of the boundary active areas allows for larger contacts which may decrease the contact resistance the active area, and thus, may decrease the total resistance of the device. Further, by increasing the size, a better source/drain epitaxial profile may be provided that reduces the contact and total resistance by increasing the contact area and by decreasing defects in the active area. This is advantageous to reduce the RC time delay that exists in integrated circuits.

Figure 5A:
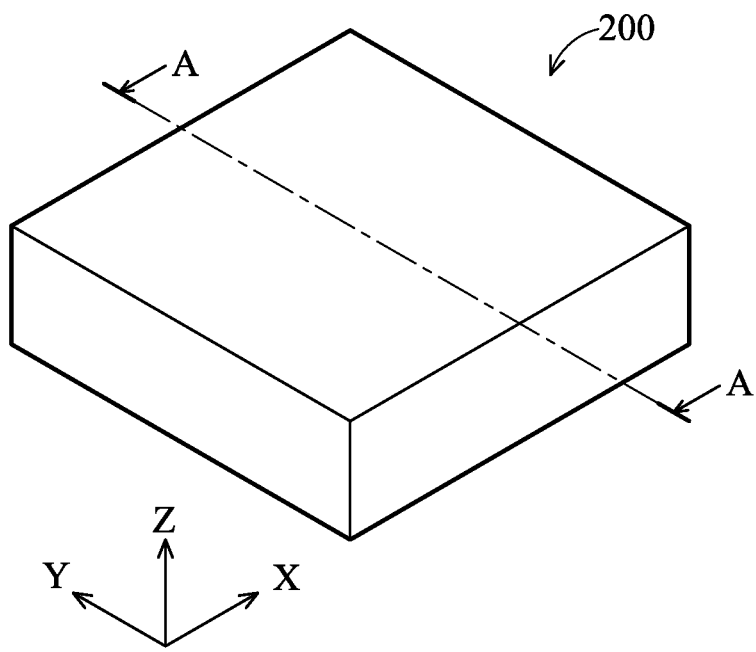
FIG. 5A is a three-dimensional illustration of a semiconductor substrate in accordance with an embodiment.
Figure 5B:
FIG. 5B is a cross-section view of the semiconductor substrate in FIG. 5A in accordance with an embodiment.
Figure 6A:
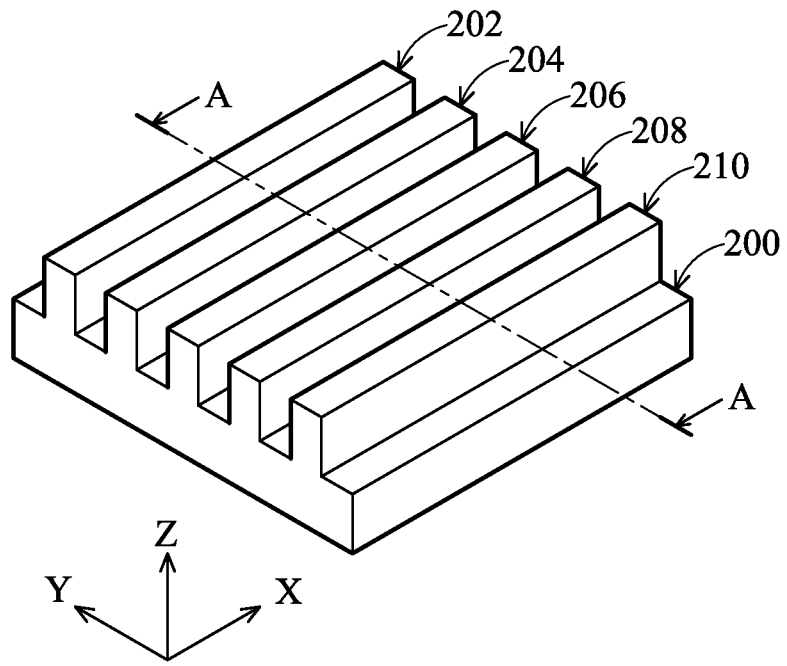
FIG. 6A is the semiconductor substrate after an etching process forms fins for FinFETs in accordance with an embodiment.
Figure 6B:
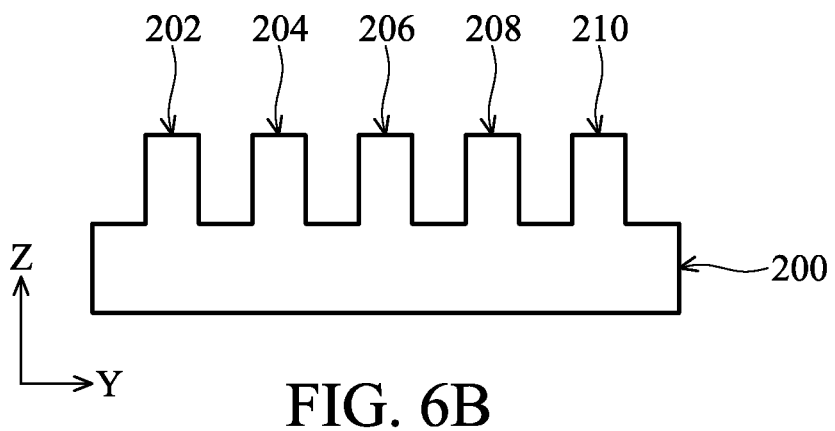
FIG. 6B is a cross-sectional view of the semiconductor substrate in FIG. 6A in accordance with an embodiment.
Figure 7A:
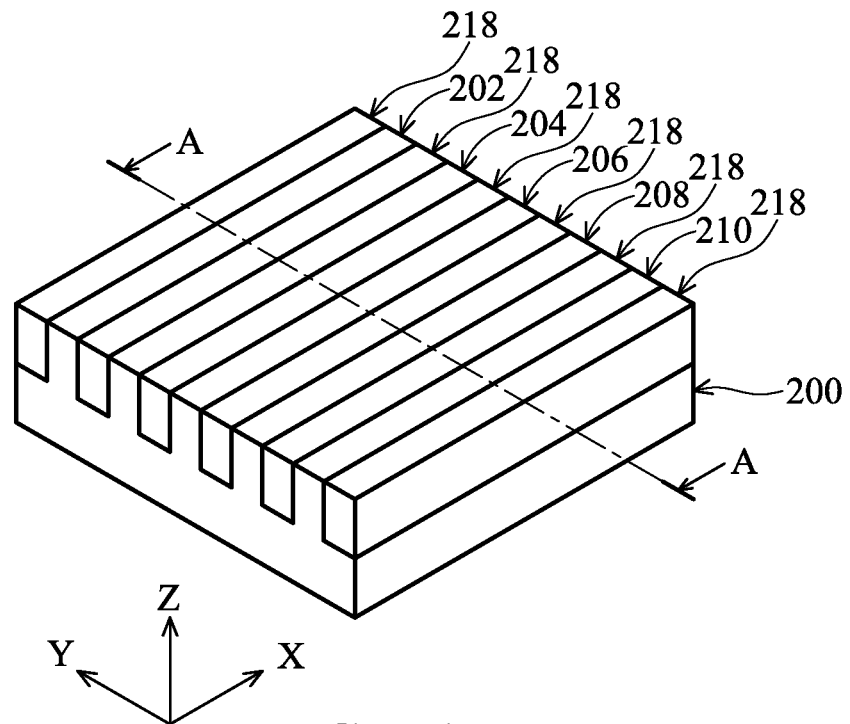
FIG. 7A is the semiconductor substrate after depositing a dielectric in accordance with an embodiment.
Figure 7B:
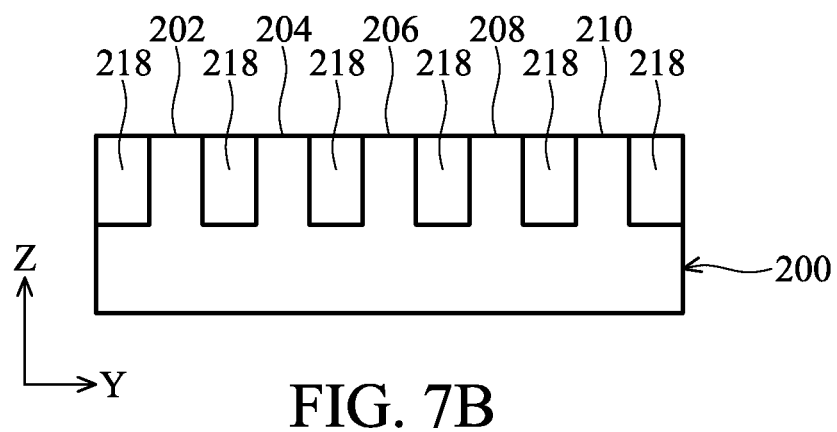
FIG. 7B is a cross-sectional view of the semiconductor substrate in FIG. 7A in accordance with an embodiment.

FIGS. 5A through 12 illustrate processes in accordance with embodiments to realize the above discussed structures. FIG. 5A illustrates a semiconductor substrate 200, such as silicon, silicon germanium, or the like. FIG. 5B is a cross-sectional view of the semiconductor substrate 200 at line A-A in FIG. 5A. FIG. 6A is the semiconductor substrate 200 after an etching process to form the fins 202, 204, 206, 208, and 210 for FinFETs. FIG. 6B is a cross-sectional view of the semiconductor substrate 200 along line A-A as depicted in FIG. 6A. FIG. 7A illustrates the semiconductor substrate 200 after a dielectric 218 is formed between the fins 202, 204, 206, 208, and 210, such as by deposition and a subsequent chemical mechanical polish (CMP), to form shallow trench isolations (STIs). FIG. 7B is a cross-sectional view of the semiconductor substrate 200 along line A-A in FIG. 7A. These processing steps are well known in the art, and detailed discussion of these steps is omitted herein for brevity.

Figure 8:
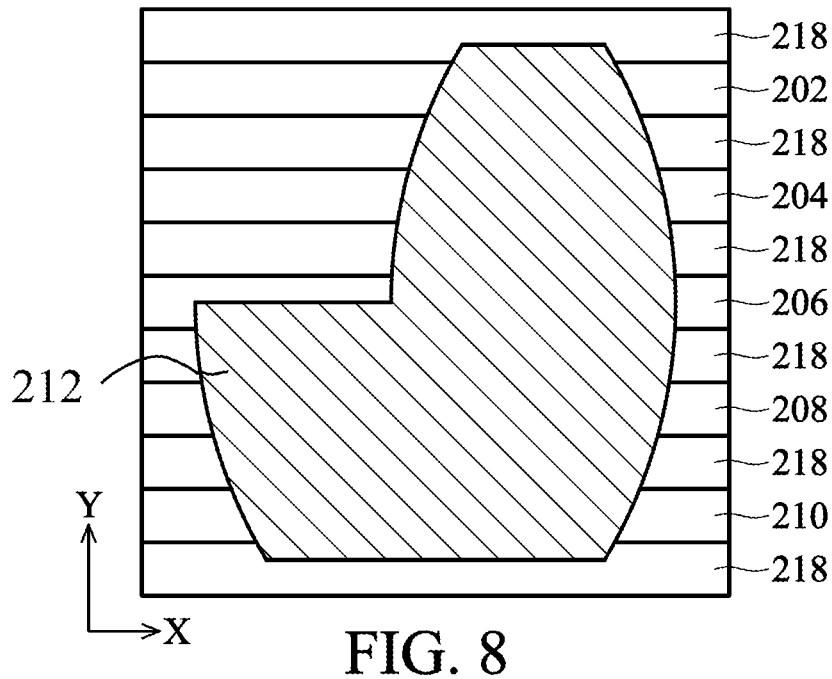
FIG. 8 is a plan view of the semiconductor substrate with fins and a protection mask in accordance with an embodiment.

FIGS. 8 through 11 illustrate steps to form the non-uniform fin active area patterns. The disclosure regarding FIGS. 8 and 10 discusses photoresists although such photoresists are not depicted in the figures for simplicity of illustration. A person having ordinary skill in the art will readily understand the application and utility of such photoresists. FIG. 8 shows a plan view of the semiconductor substrate 200 with fins 202, 204, 206, 208, and 210 and dielectric 218. The semiconductor substrate has formed thereon a layer of photoresist (not illustrated), which is exposed in accordance with a mask illustrated by an opaque area 212. The opaque area 212 defines the area in which the non-uniform active area pattern will lie. The mask allows the photoresist overlying the portions of the fins 202, 204, 206, 208 and 210 that are to be removed to be exposed to light. This illustration represents that the mask may be a dark tone mask used with a positive photoresist. The exposed positive photoresist becomes soluble and is removed from the surface. The positive photoresist that was unexposed remains over the portions of the fins 202, 204, 206, 208, and 210 that will remain.

Figure 9:
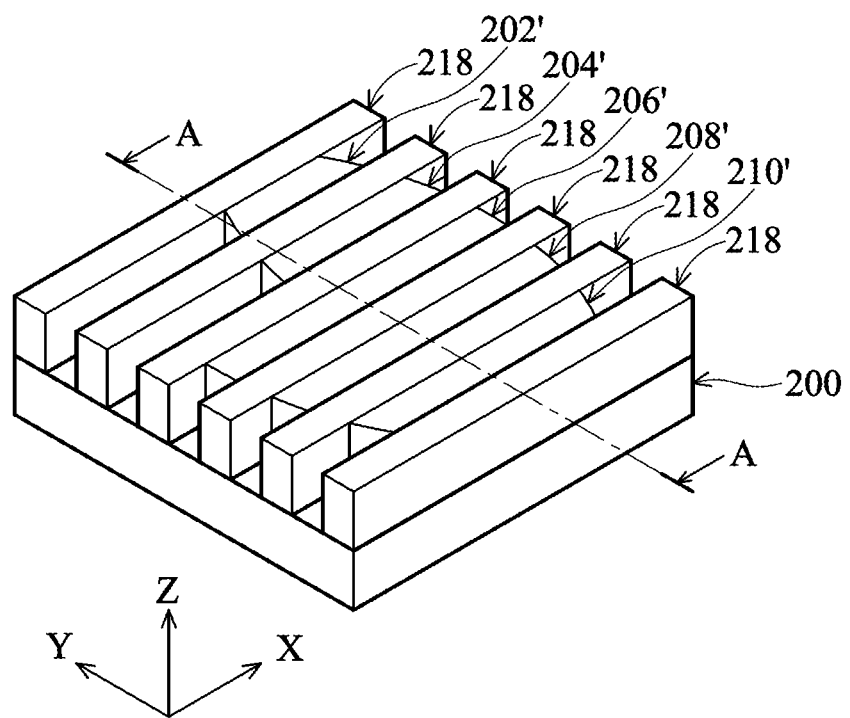
FIG. 9 is a three-dimensional view of the substrate after the etching process in FIG. 8 in accordance with an embodiment.

The edges of the opaque area 212 of the mask that do not run parallel to the x-axis direction represent convex arcs relative to the interior portion of the opaque area 212. The active areas will conform to the outlines of the convex arcs. An etch process is performed to remove portions of the exposed fins 202, 204, 206, 208, and 210. The etch process uses etchants that selectively etch the fins 202, 204, 206, 208, and 210 but not the dielectric 218. FIG. 9 shows a three-dimensional view of the substrate 200 after the etching process described with respect to FIG. 8. The fins 202', 204', 206', 208', and 210' are what remain after the etch and form the non-uniform active area pattern with edges that conform to a convex arc.

Figure 10:
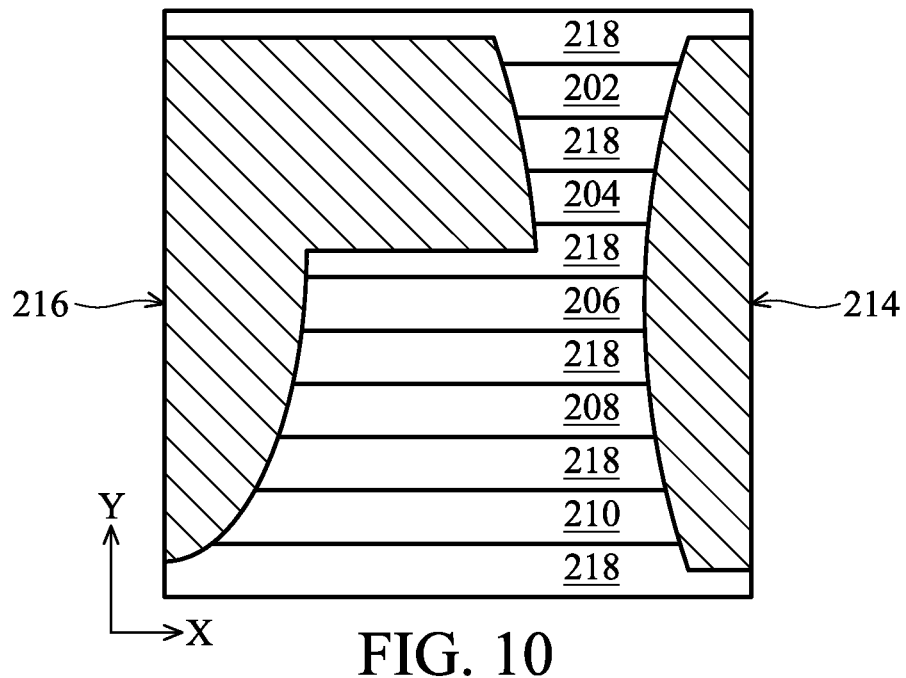
FIG. 10 is a plan view of the semiconductor substrate with fins and cutting masks in accordance with an embodiment.
Figure 11:
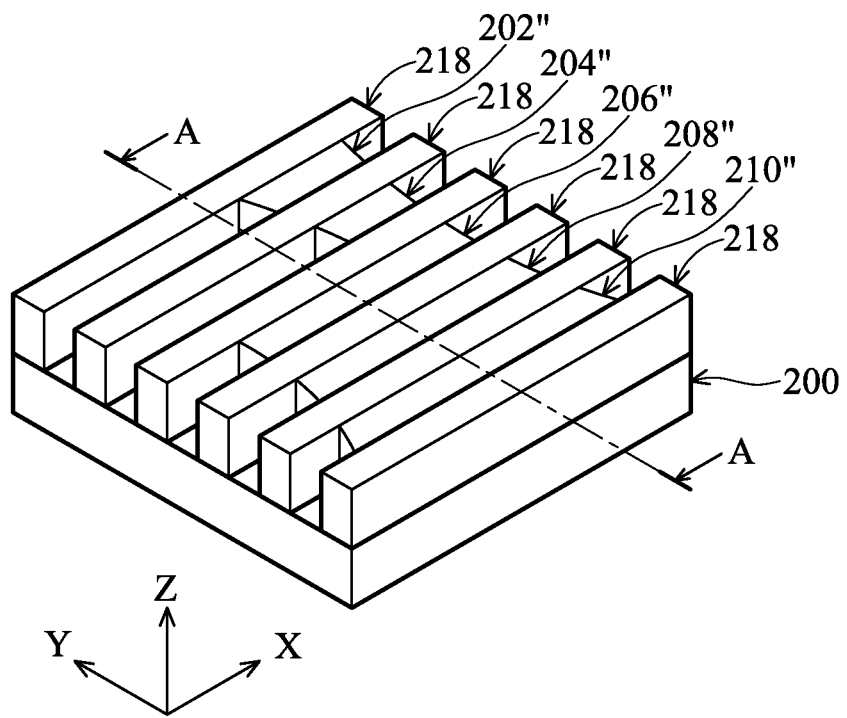
FIG. 11 is a three-dimensional view of the substrate after the etching process in FIG. 10 in accordance with an embodiment.
Figure 12:
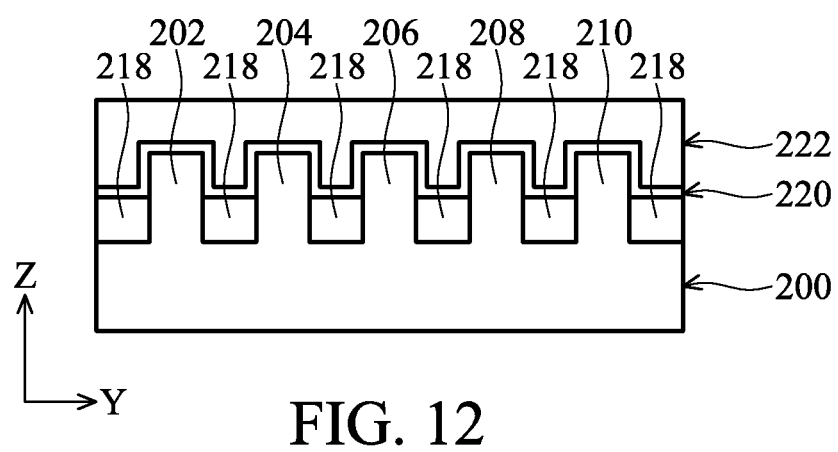
FIG. 12 is a cross-sectional view of the substrate in either FIG. 9 or 11 after the completion of the formation of the FinFETs in accordance with an embodiment.

FIGS. 10 and 11 show another method for etching. FIG. 10 shows a plan view of the semiconductor substrate 200 with fins 202, 204, 206, 208, and 210 and dielectric 218. The semiconductor substrate has formed thereon a layer of photoresist (not illustrated), which is exposed in accordance with a cutting mask illustrated by opaque areas 214 and 216. The transparent area outside of the opaque areas 214 and 216 defines the area in which the non-uniform active area pattern will be. The cutting mask does not allow the photoresist overlying the portions of the fins 202, 204, 206, 208 and 210 that are to be removed to be exposed to light. This illustration represents that the cutting mask may be a clear tone mask used with a negative photoresist. The unexposed negative photoresist is soluble and is removed. The portions of the negative photoresist not underlying the opaque areas 214 and 216 are exposed, and the photoresist remains in those areas.

The edges of the opaque areas 214 and 216 that do not lie in the x-axis direction represent concave arcs with respect to the interior portion of the area of the fins 202, 204, 206, 208, and 210 over which the resist is exposed. The active areas will conform to the outlines of the concave arcs. A etch process is performed to remove portions of the fins 202, 204, 206, 208, 210 covered by the photoresist that was unexposed by opaque areas 214 and 216. FIG. 11 shows a three-dimensional view of the substrate 200 after the etch described with respect to FIG. 10. The fins 202", 204", 206", 208", and 210" are what remain after the cutting process and form the non-uniform active area pattern with edges that conform to a concave arc.

After the processes described in FIGS. 8 and 9 or FIGS. 10 and 11, the remainder of the FinFETs may be formed using conventional methods. For example, in FIG. 12, the dielectric 218 is recessed, a gate dielectric 220 layer is formed, and a gate electrode 222 is formed. Thus, the structures in FIG. 2 or 4 may be created.

Although embodiments and their advantages have been described in detail, it should be understood that various changes, substitutions and alterations can be made herein without departing from the spirit and scope of the invention as defined by the appended claims. For example, the cutting masks and protection masks may either be used to form concave or convex arcs, and the above description does not limit the use for either type of mask. Further, it will be readily understood by those skilled in the art that processes for forming FinFETs may be varied while remaining within the scope of embodiments. The use of a buried oxide (BOX) or silicon on insulator (SOI) is commonly known and may be substituted in the above described structures and processes. Further, the formation of the fin active areas may be accomplished by epitaxial growth. Even further, embodiments contemplate any application in which it is desirable for any active area to have a decreased contact resistance or decreased STI stress.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor device, the method comprising:
    providing a semiconductor substrate;
    forming a photoresist layer over the semiconductor substrate;
    patterning the photoresist layer to expose an exposed portion of the semiconductor substrate using a photomask, wherein the photomask comprises a transparent area comprising a first curved edge, and wherein the first curved edge defines a second curved edge of the exposed portion of the semiconductor substrate; and
    etching the exposed portion of the semiconductor substrate such that the second curved edge of the exposed portion of the semiconductor substrate defines third curved edges of active areas in the semiconductor substrate, wherein each active area comprises a longitudinal length intersecting at least one respective third curved edge.

2. The method of claim 1, further comprising before the patterning, forming strips that comprise the active areas in the semiconductor substrate.

3. The method of claim 1, wherein the active areas are fin active areas.

4. The method of claim 1, wherein the photoresist layer comprises a positive photoresist, and the photomask comprises a dark tone photomask.

5. The method of claim 1, wherein the photoresist layer comprises a negative photoresist, and the photomask comprises a clear tone photomask.

6. The method of claim 1, wherein the first curved edge of the photomask is arc-shaped.

7. A method for forming a semiconductor device, the method comprising:
    providing a semiconductor substrate;
    forming fins on the semiconductor substrate; and
    patterning the fins such that each of the fins comprises an edge and the edges of the fins form an arc.

8. The method of claim 7, wherein the arc is convex.

9. The method of claim 7, wherein the arc is concave.

10. The method of claim 7, wherein the patterning comprises:
    patterning a photoresist over the fins to expose an exposed portion of the fins by using a photomask that comprises a curved edge that defines the arc; and
    etching the exposed portion of the fins.

11. The method of claim 10, wherein the photoresist comprises a negative photoresist, and the photomask comprises a clear tone photomask.

12. The method of claim 10, wherein the photoresist comprises a positive photoresist, and the photomask comprises a dark tone photomask.

13. The method of claim 7, further comprising:
    forming a gate dielectric on the fins; and
    forming a gate electrode on the gate dielectric.

14. A method comprising:
    forming fins in a semiconductor substrate, the fins having respective parallel longitudinal axes;
    forming a mask over the fins, the mask having a curved edge, the curved edge intersecting the parallel longitudinal axes; and
    etching the fins to transfer a pattern of the mask to the fins such that the fins have respective edges that are curved.

15. The method of claim 14, wherein the forming the mask comprises using a photomask, the mask comprising a photoresist.

16. The method of claim 15, wherein the photoresist comprises a negative photoresist, and the photomask comprises a clear tone photomask.

17. The method of claim 15, wherein the photoresist comprises a positive photoresist, and the photomask comprises a dark tone photomask.

18. The method of claim 14, wherein the respective edges of the fins form a convex curve.

19. The method of claim 14, wherein the respective edges of the fins form a concave curve.

20. The method of claim 14 further comprising:
    forming a gate dielectric on the fins; and
    forming a gate electrode on the gate dielectric.

* * * * *